United States Patent
Meinhold

(10) Patent No.: US 9,618,561 B2
(45) Date of Patent: Apr. 11, 2017

(54) SEMICONDUCTOR DEVICE AND METHOD FOR DETECTING DAMAGING OF A SEMICONDUCTOR DEVICE

(71) Applicant: Infineon Technologies AG, Neubiberg (DE)

(72) Inventor: Dirk Meinhold, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 334 days.

(21) Appl. No.: 14/197,564

(22) Filed: Mar. 5, 2014

(65) Prior Publication Data

US 2015/0253375 A1   Sep. 10, 2015

(51) Int. Cl.
| | |
|---|---|
| *G01R 31/26* | (2014.01) |
| *B81B 7/02* | (2006.01) |
| *B81C 99/00* | (2010.01) |
| *H01L 21/66* | (2006.01) |
| *G01L 27/00* | (2006.01) |

(52) U.S. Cl.
CPC ............ *G01R 31/2644* (2013.01); *B81B 7/02* (2013.01); *B81C 99/0035* (2013.01); *G01L 27/007* (2013.01); *H01L 22/30* (2013.01); *B81B 2201/0264* (2013.01); *H01L 22/34* (2013.01)

(58) Field of Classification Search
None
See application file for complete search history.

(56) References Cited

U.S. PATENT DOCUMENTS

| | | | | |
|---|---|---|---|---|
| 8,125,046 B2* | 2/2012 | Mueller | ............. | B81C 1/00246 257/501 |
| 8,921,952 B2* | 12/2014 | Dawson | ............. | B81C 1/00015 257/415 |
| 9,145,292 B2* | 9/2015 | Winkler | ............. | B81C 1/00246 |
| 2008/0067895 A1 | 3/2008 | Adachi et al. | | |
| 2008/0283943 A1* | 11/2008 | Dekker | ............. | B81C 1/00293 257/415 |
| 2010/0084721 A1* | 4/2010 | Wu | ............. | B81B 3/0072 257/415 |
| 2013/0234140 A1 | 9/2013 | Schiller et al. | | |
| 2013/0305804 A1* | 11/2013 | Burchard | ............ | B81C 99/0045 73/1.01 |

(Continued)

FOREIGN PATENT DOCUMENTS

| | | |
|---|---|---|
| CN | 101295624 A | 10/2008 |
| CN | 101389566 A | 3/2009 |

(Continued)

OTHER PUBLICATIONS

English translation of JP-2010-210402 filed on Sep. 24, 2010.*

(Continued)

*Primary Examiner* — Jermele M Hollington
(74) *Attorney, Agent, or Firm* — Schiff Hardin LLP

(57) ABSTRACT

A micro-electro-mechanical device includes a movable structure. The movable structure includes a test structure changing an electrical characteristic, if the movable structure is damaged. Further, a method for detecting damaging of a micro-electro-mechanical device includes detecting a change of an electrical characteristic of the electrical test structure of the movable structure. Further, the method includes indicating a deviation of the electrical characteristic from a predefined tolerable range.

19 Claims, 5 Drawing Sheets

(56) References Cited

U.S. PATENT DOCUMENTS

2015/0059484 A1\* 3/2015 Dawson ................ G01L 9/0072
 73/718
2015/0162418 A1\* 6/2015 Meiser .............. H01L 21/76898
 438/138
2015/0332956 A1\* 11/2015 Bieselt .............. H01L 21/76229
 257/510

FOREIGN PATENT DOCUMENTS

| CN | 101644718 | A |   | 2/2010  |            |           |
|----|-----------|---|---|---------|------------|-----------|
| JP | 2010210402 | A | \* | 9/2010  | ............... | G01L 9/00 |
| JP | 2011174876 | A | \* | 9/2011  | ............. | G01F 1/692 |

OTHER PUBLICATIONS

English translation of JP-2011-174876 filed on Sep. 8, 2011.\*
Office Action dated Feb. 5, 2016 for Chinese Patent Application No. 201510187614.X.

\* cited by examiner

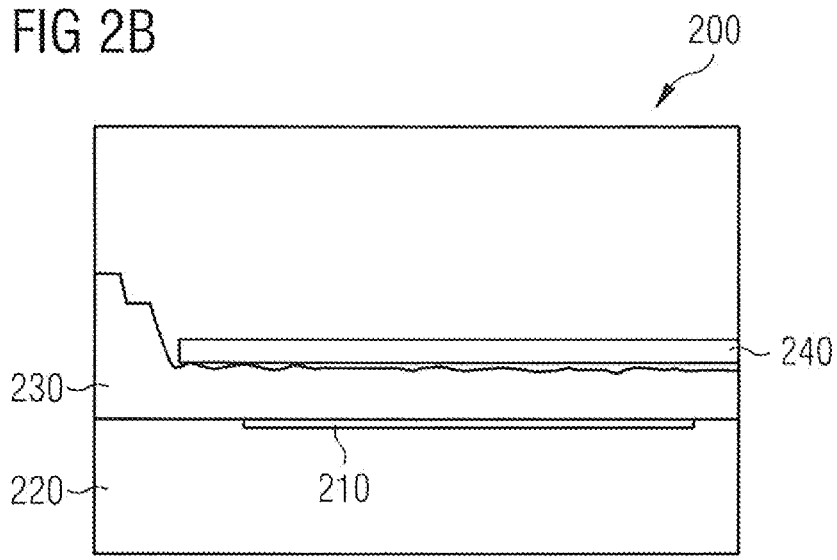
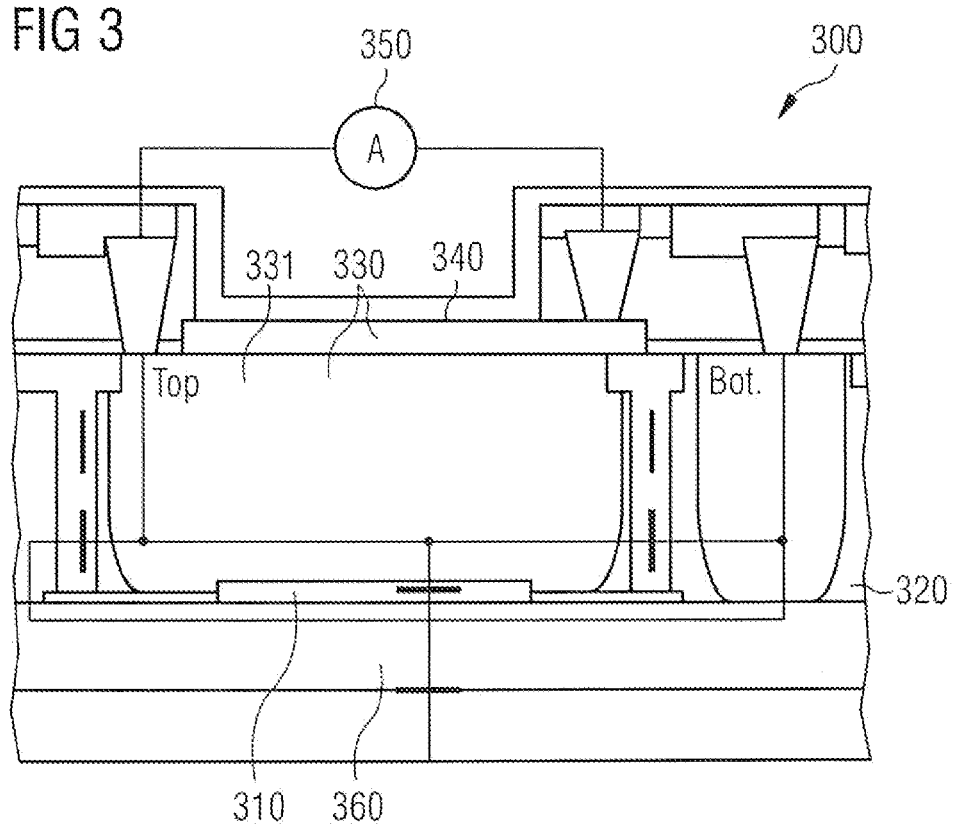

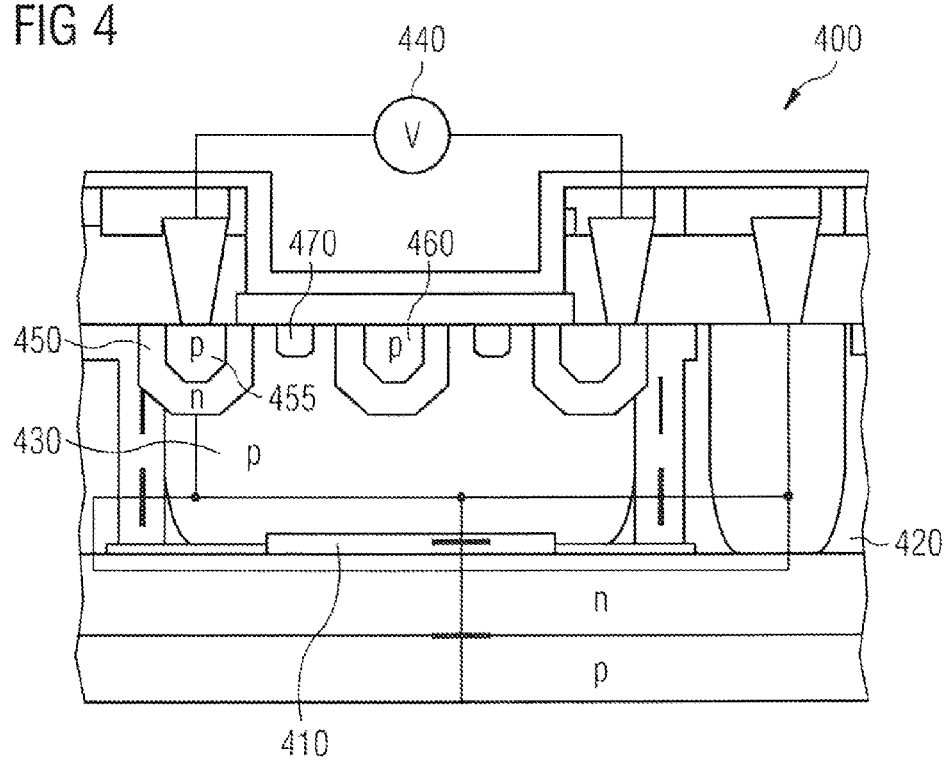

SEMICONDUCTOR DEVICE AND METHOD FOR DETECTING DAMAGING OF A SEMICONDUCTOR DEVICE

TECHNICAL FIELD

Embodiments relate to a semiconductor device and in particular to a semiconductor device comprising a membrane structure and a method for detecting damaging of the membrane structure of a semiconductor device.

BACKGROUND

For semiconductor devices comprising a membrane structure as e.g. for an integrated pressure sensor one major yield and reliability risk are cracks of the membrane structure. Certain effort is spent on detecting these cracks. These cracks can for example be detected inline by optical inspection. It may be desired to provide a semiconductor device with more comfortable crack detection.

SUMMARY

Some embodiments relate to a micro-electro-mechanical device comprising a movable structure. The movable structure comprises a test structure changing an electrical characteristic, if the movable structure is damaged.

Some embodiments relate to a semiconductor device. The semiconductor device comprises a cavity arranged between at least a part of a semiconductor substrate and a membrane structure. The membrane structure comprises an electrical test structure changing an electrical characteristic, if the membrane structure is damaged.

Some embodiments relate to a method for monitoring damaging of a semiconductor device. The semiconductor device comprises a cavity arranged between at least a part of a semiconductor substrate and a membrane structure. The membrane structure comprises an electrical test structure. The method comprises detecting a change of an electrical characteristic of the electrical test structure, if the membrane structure is damaged.

BRIEF DESCRIPTION OF THE FIGURES

Some embodiments of apparatuses and/or methods will be described in the following by way of example only, and with reference to the accompanying figures, in which

FIGS. 2a and 2b show schematic cross-sections of a semiconductor device;

FIG. 3 shows a schematic cross-section of a semiconductor device

FIG. 4 shows a schematic cross-section of a semiconductor device;

DETAILED DESCRIPTION

Figure 1:
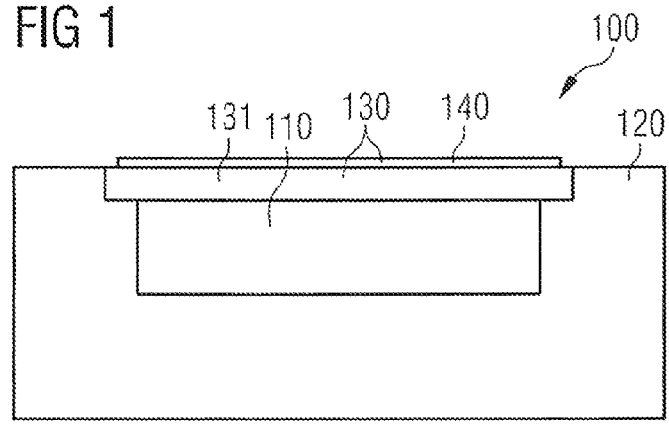
FIG. 1 shows a schematic cross-section of a semiconductor device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, acts, operations, elements and/or components, but do not preclude the presence or addition of one or more other features, integers, acts, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Some embodiments relate to a micro-electro-mechanical device comprising a movable structure. The movable structure comprises a test structure changing an electrical characteristic, if the movable structure is damaged.

By integrating a test structure to the movable structure a damage of the moveable structure may be easily detectable. Further, a detection of damage may be possible independent from a main functionality of the movable structure (e.g. pressure or acceleration measurement or providing microphone or actuator functionality).

Damage may be any undesired change or alteration of the moveable structure. Damage may be caused by an upcoming or existing crack within or through the movable structure or an undesired particle disturbing the manufacturing of the moveable structure, for example.

Such damage may be detectable by a defect detection circuit connected to the movable structure. A defect detection circuit may measure the electrical characteristic of the test structure or may detect a change of the electrical characteristic of the test structure and may compare the measured value or the detected change with a predefined upper or lower threshold, for example. Optionally, the defect detection circuit may indicate (e.g. by generating a defect detection signal) an increase above the upper limit or a decrease below the lower limit.

An upcoming or existing damage may be detectable during manufacturing, assembly and/or operation of the micro-electro-mechanical device.

The movable structure may be any movable element used by a micro-electro-mechanical device. For example, the moveable structure may be a cantilever, a bridge or a membrane structure. The movable structure may be deformed due to an external force (e.g. varying pressure or acceleration). In other words, at least a part of the movable structure may be movable or repeatedly deformable in relation to a part of the micro-electro-mechanical device holding the movable structure.

The micro-electro-mechanical device may comprise a cavity arranged between at least a part of a substrate and the movable structure. Alternatively, the movable structure may be part of the substrate and the substrate may comprise a hole through the substrate behind or below the movable structure providing sufficient space for the movement of the movable structure, for example.

The substrate may be a semiconductor substrate, a glass substrate or a fused silica substrate, for example.

In the following further examples are shown. These examples relate to micro-electro-mechanical devices being semiconductor devices comprising a semiconductor substrate with a membrane structure. However, details or aspects described below are also applicable to examples described above (e.g. other substrates or other movable structures).

FIG. 1 shows a schematic cross-section of a semiconductor device 100 according to an example. The semiconductor device 100 comprises a semiconductor substrate 120. The semiconductor device 100 comprises a membrane structure 130. The semiconductor device 100 comprises a cavity 110 arranged between at least a part of the semiconductor substrate 120 and the membrane structure 130. The membrane structure 130 comprises an electrical test structure 140. In case the membrane structure 130 is damaged, e.g. due to a crack in the membrane structure, an electrical characteristic (e.g. leakage current, resistance or breakdown voltage, tunnel current) of the electrical test structure 140 is changed due to the damaged membrane structure 130.

The cavity 110 may for example be formed on top of or adjacent to a main surface of the semiconductor substrate 120. A main surface of the semiconductor substrate 120 may be a semiconductor surface of the device towards metal layers, insulation layers or passivation layers on top of the semiconductor substrate. In comparison to a basically vertical edge (e.g. resulting from separating a semiconductor die from others) of the semiconductor substrate 120, the main surface of the semiconductor substrate 120 may be a basically horizontal surface extending laterally.

The cavity 110 may also for example be at least partially in or on the semiconductor substrate 120. For example the cavity 110 may be formed on the semiconductor substrate 120. For example, the membrane structure 130 may be arranged above the semiconductor substrate 120. At least a part of the membrane structure 130 may for example be disposed at a distance from the semiconductor substrate 120 to form the cavity 110. Alternatively, the cavity 110 may be arranged within the semiconductor substrate 120 and a part of the semiconductor substrate 120 remaining above the cavity may form a membrane layer (micro-electro-mechanical element) of the membrane structure 130.

The semiconductor substrate 120 of the semiconductor device may be a silicon-based semiconductor substrate, a silicon carbide-based semiconductor substrate, a gallium arsenide-based semiconductor substrate or a gallium nitride-based semiconductor substrate, for example. The semiconductor substrate 120 may for example be a monocrystalline silicon substrate, a polycrystalline silicon substrate, an amorphous silicon substrate, or a microcrystalline silicon substrate. Besides, the semiconductor substrate 120 may for example be an N-type semiconductor substrate or a P-type semiconductor substrate.

The membrane structure 130 may for example be a Micro Electromechanical Systems (MEMS) structure. The membrane structure 130 may comprise at least a membrane layer (micro-electro-mechanical element) 131 being part of the electrical test structure 140 or carrying the electrical test structure 140. The membrane layer 131 may be movable in response to an applied force. The membrane structure 130 may for example be clamped at one or more edges to the semiconductor substrate 120 or a surrounding layer (e.g. metal layer) in order to form a structure hanging above the cavity 110. The space between the membrane structure 130 and the semiconductor substrate 120 for example forms the cavity 110. The membrane structure 130 may comprise a significantly larger dimension in both lateral directions (e.g. more than 2 times, more than 5 times or more than 10 times larger) than in the vertical direction.

In that the membrane structure 130 comprises an electrical test structure 140 damages, as e.g. cracks in the membrane structure 130 may be detected in any stage of manufacturing and at any stage of field life. The electrical test structure 140 may for example be a functional structure on and/or in the membrane structure 130, or at least in a part of the membrane structure 130. Damages of the membrane structure 130, for example the membrane layer 131 may be detected with the electrical test structure 140.

For example, the electrical test structure 140 may be or comprise an electrical conductive layer of the membrane structure 130. Cracks in the membrane structures 130 or the membrane layer 131 of e.g. a pressure sensor or microphone can pose a yield and reliability loss. By integrating an electrical test structure 140 in the membrane structure for detection of damages, the device integrity may be verified electrically. E.g. standard CMOS steps and/or modules may be used without any increase of wafer cost to set up functional structures on and/or in the membrane structure 130 or membrane layer 131. By using the semiconductor device 100 as described in the embodiments herein electrical damage detection as e.g. the detection of cracks in the membrane structure 130 may be applicable during frontend processing, preassembly, assembly and in field during lifetime of the semiconductor device. By detection of damages the reliability of the semiconductor device 100 may for example be increased. Besides, the electrical test structure 140 induces no chip area penalty.

The membrane structure 130 may for example comprise an electrical conductive layer. The electrical conductive layer may represent at least a part of the electrical test structure 140 of the membrane structure 130. The electrical conductive layer may for example be arranged over at least a part of the membrane layer 131 of the membrane structure 130. For example, the electrical conductive layer may be arranged over the complete membrane structure 130 or only over a certain section of the membrane structure 130. The electrical conductive layer may be electrically isolated from the membrane layer 131. The electrical conductive layer may for example be made of or consist at least partially of poly silicon, aluminum (Al), copper (Cu), etc.

A defect detection circuit may for example be connected to the membrane 131 and the electrical conductive layer. The defect detection circuit may for example be integrated in the semiconductor device 100. For example, the membrane structure and the defect detection circuit may be implemented on the same semiconductor die. By using an integrated defect detection circuit standard CMOS steps and/or modules may be used for manufacturing. Using standard CMOS steps and/or modules can be used to set up functional structures on and/or in the membrane structure to verify the semiconductor device integrity electrically without increase of wafer cost. Further there is no change of the integration scheme of the semiconductor device. The costs for crack detection may be reduced significant.

A crack in the membrane structure 130 may lead to an increased leakage current. The defect detection circuit may for example detect the increase of the leakage current. A crack in the membrane structure 130 may also lead to a decrease of a breakthrough voltage between the electrical conductive layer and the membrane layer 131. The defect detection circuit may alternatively or additionally detect the decrease of a breakthrough voltage between the electrical conductive layer and the membrane layer 131. Thus, an increase of the leakage current or alternatively or additionally a decrease of a breakthrough voltage between the electrical conductive layer and the membrane layer 131 may indicate a crack in the membrane structure 130 or at least in a part of the membrane structure 130, for example in the membrane layer 131.

Figure 2A:
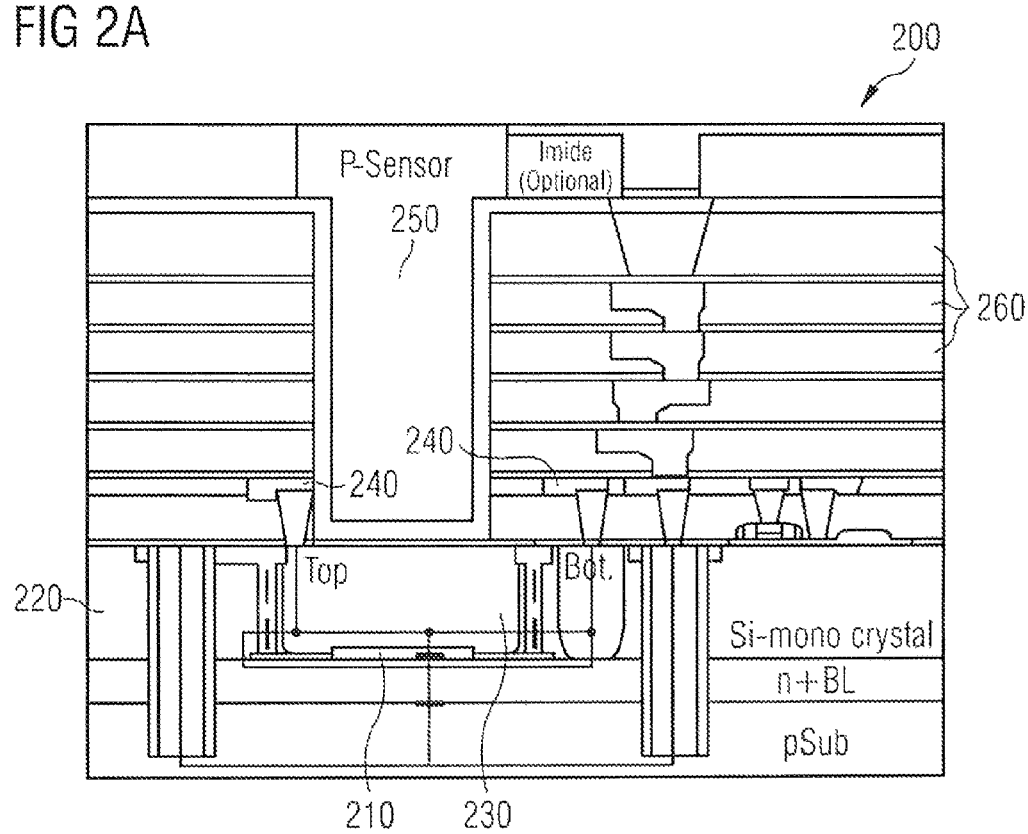

FIG. 2a shows a schematic cross-section of a semiconductor device 200 comprising an integrated pressure sensor according to an example. The semiconductor device 200 comprises a semiconductor substrate 220. The semiconductor device 200 comprises a membrane structure 230. The semiconductor device 200 comprises a cavity 210 arranged between at least a part of the semiconductor substrate 220 and the membrane structure 230 forming a pressure sensitive element. The semiconductor substrate 220 may for example be a monocrystalline silicon, comprising e.g. an N-type substrate. The membrane structure 230 may comprise an epitaxial layer. P+-type and N+-type regions are arranged as electrode region, contact regions 240 and other regions above the semiconductor substrate 220.

The semiconductor device 200 comprises an access hole 250, which provides for example access to the membrane structure 230. With the access hole 250, the pressure of the environment may for example be detected due to a movement of the membrane structure 230. If the pressure of the environment is higher than the pressure in the cavity 210 below the membrane structure 230 the volume of the cavity 210 would be compressed. Otherwise, if the pressure of the environment is lower than the pressure in the cavity 210 below the membrane structure 230 the volume of the cavity 210 would be decompressed. Due to the pressure acting on the membrane structure 230, a distortion of the membrane structure 230 may induce a compression or decompression of the cavity 210 below the membrane structure 240. The distortion of the membrane structure 230 may be detected by a sensing circuit. The sensing circuit may for example be integrated in the semiconductor device 200. The semiconductor device shown in FIG. 2a comprises a multilayer structure 260. The multilayer structure 260 may for example comprise various vias and further electrical components as for example transistors, resistors, and so on integrated in various layers of the semiconductor device 200.

For example, a defect detection circuit connected to the movable structure may detect a change of the electrical characteristic of the test structure independent from a sensing circuit detecting a main function (e.g. pressure or acceleration measurement or providing microphone or actuator functionality) of the movable structure.

Further, the membrane layer 231 may for example be an epitaxial layer or for example poly silicon layers. The epitaxial layer may for example have a thickness between 1 and 8 µm, for example between 2 and 7 µm or for example between 2.7 and 6.7 µm.

The membrane structure 230 may be implemented simultaneously with gate electrodes of transistors of the semiconductor device. The gate material (e.g. poly silicon) may for example function as the electrical conductive layer and may be insulated from the membrane layer by the gate oxide. The gate material and consequently the electrical conductive layer of the membrane structure may for example have a thickness of 100 to 300 nm or between 100 and 200 nm, for example 180 nm, 170 nm or 150 nm. The gate material may for example further function e.g. as a etch stop layer for the sensor release etch at the backend of line.

The semiconductor device 200 may comprise one or more additional features corresponding to the concept or one or more embodiments described above.

FIG. 2b shows a microscopic picture of a section of the membrane structure of the semiconductor device shown in FIG. 2a. A cavity 210 is arranged between a semiconductor substrate 220 and a membrane structure 230, comprising a membrane layer 231 arranged above the semiconductor substrate 210. The membrane structure 230 comprises an electrical conductive layer 240 as for example part of an electrical test structure.

FIG. 3 shows a schematic cross-section of a semiconductor device 300 according to an example. The semiconductor device 300 comprises a semiconductor substrate 320. The semiconductor device 300 comprises a membrane structure 330. The semiconductor device 300 comprises a cavity 310 arranged between at least a part of the semiconductor substrate 320 and the membrane structure 330. The membrane structure 330 comprises an electrical test structure 340. In case the membrane structure 330 is damaged, e.g. due to a crack in the membrane structure, an electrical characteristic of the electrical test structure 340 may be changed due to a damaged membrane structure 330, or at least a part of the membrane structure 330, for example a membrane layer.

The membrane structure 330 may comprise an electrical conductive layer 340. The electrical conductive layer 340 may represent at least a part of the electrical test structure of the membrane structure. The electrical conductive layer 340 may be arranged over at least a part of the membrane layer. The electrical conductive layer 340 may be electrically isolated from the membrane layer.

The electrical conductive layer may be manufacturable or manufactured simultaneously with a gate electrode of a transistor of the semiconductor device. Thus, an additional process step may be avoided. Alternatively, the electrical conductive layer may for example be manufactured separately from a gate electrode of a transistor of the semiconductor device. The electrical conductive layer may for example be made of or consist at least partially of gate oxide (gox), a thin oxide (tox) or a dual gate oxide (dgox).

The electrical conductive layer may for example be isolated from the membrane by an oxide manufacturable or manufactured simultaneously with a gate oxide of a transistor of the semiconductor device. Thus, an additional process step may be avoided.

A defect detection circuit 350 may be connected with the electrical test structure to measure for example a change of an electrical characteristic of the electrical test structure. For example the defect detection circuit 350 may measure an increase of a leakage current (A) between the electrical conductive layer 340 as part of the electrical test structure and the membrane layer 331. The defect detection circuit 350 may alternatively or additionally detect a decrease of a breakthrough voltage between the electrical conductive layer 340 and the membrane layer 331.

Further, the electrical test structure may comprise an electrically conductive structure electrically insulated from a membrane layer of the membrane structure. The electrically conductive structure may be reaching throughout more than 50% of the whole membrane layer, a comb structure or a serpentine structure, for example. For example, the electrically conductive structure may be reaching throughout more than 60%, or for example more than 70%, or more than 80%, or more than 90%, or for example 100% of the whole membrane layer.

The semiconductor device 300 may comprise a sensing circuit configured to sense a distortion of the membrane structure 330. The sensing circuit may for example sense a distortion of the membrane structure 330 based on detecting a change of a capacity depending on the distortion of the membrane structure 330. The sensing circuit may sense a distortion of the membrane structure 330 based for example on using a piezoresistive structure.

Alternatively, the sensing circuit may for example comprise a capacitive sensing element. The capacitive sensing element may for example comprise a backside electrode 360 which may form together with the membrane layer as a frontside electrode of the capacitive sensing element a capacity with a capacitance varying due to a distortion of the membrane structure 330.

According to an example, the semiconductor device may for example be a pressure sensor, a microphone or any other electrical semiconductor device comprising a membrane arranged over a cavity and being used to use a physical effect combined with a movement of the membrane of the semiconductor device. For example the semiconductor device may be a Micro Electromechanical Systems (MEMS).

A pressure sensor converts a variation in pressure into a variation of an electrical quantity (e.g. a resistance or a capacitance). In the case of a semiconductor sensor, the pressure variation is detected by a membrane of semiconductor material or another material used for a layer of the semiconductor device (e.g. comprising aluminum (Al) or copper (Cu)), which overlies a cavity and is able to undergo deflection under mechanical stress.

Pressure sensors using semiconductor technology can find their application in medicine, in household appliances, in consumer electronics (cell-phones, PDAs—Personal Digital Assistants), and in the automotive field for example. In particular, in the latter sector, pressure sensors may be used for detecting the pressure of the tires of motor vehicles, and may be used by the control unit for alarm signaling. Pressure sensors may be, on the other hand, also used for monitoring air-bag pressure, for controlling the breakdown pressure of the ABS, and for monitoring the pressure of oil in the engine, the pressure of injection of the fuel, etc.

For example existing sensors manufactured using the semiconductor technology may for example be piezoresistive or capacitive sensors.

Operation of piezoresistive sensors may be based upon piezoresistivity, i.e., the capability of some materials to modify their resistivity as the applied pressure varies. Piezoresistors may be formed on the edge of a suspended membrane (or diaphragm) and may be connected to one another in a Wheatstone-bridge configuration for example. Application of a pressure may cause a deflection of the membrane, which may generate a variation in the offset voltage of the bridge. By detecting the voltage variation with an appropriate electronic circuit, e.g. the sensing circuit, it may be possible to derive the desired pressure information.

Operation of capacitive sensors may be based upon a change of capacity, i.e., the capability to modify the capacity upon a change of distance between two electrodes as the applied pressure varies. For example a first electrode or backside electrode of the capacitive sensor may be the semiconductor device in the area of the cavity or a metallization layer on or above the semiconductor device. A second or frontside electrode may be the membrane layer itself or a metallization layer on the backside of the membrane layer, i.e. on the side of the membrane layer facing the cavity. Application of a pressure may cause a variation in the distance between the first and second electrode, which may generate a variation in the capacity. By detecting the capacity variation with an appropriate electronic circuit, e.g. the sensing circuit, it may be possible to derive the desired pressure information.

The semiconductor device 300 may comprise one or more additional features corresponding to the concept or one or more embodiments described above.

FIG. 4 shows a schematic cross-section of a semiconductor device 400 according to a further example. In the example shown in connection with FIG. 4, the semiconductor device 400 comprises a semiconductor substrate 420. The semiconductor device 400 comprises a membrane structure 430. The semiconductor device 400 comprises a cavity 410 arranged between at least a part of the semiconductor substrate 420 and the membrane structure 430. The membrane structure 430 may for example comprise a pn-junction 455 between a first lateral doping region 450 of the membrane structure 430 and a second lateral doping region 460 of the membrane structure 430.

Additionally, the membrane structure 430 may comprise a shallow trench isolation serpentine structure laterally separating two electrical conductive comb structures of the electrical test structure. Alternatively, the membrane structure 430 may comprise at least two shallow trench isolation comb structures laterally separated by an electrical conductive serpentine structure of the electrical test structure. The electrical test structure may be insulated from a membrane layer of the membrane structure 430. In this way, an electrically conductive structure may be integrated to the membrane structure 430 being able to detect a damage of a part of the membrane structure 430 or the whole membrane structure 430 due to a change of an electrical characteristic (e.g. leakage current, resistance or breakdown voltage), if a damage occurs.

Alternatively, a p-doped region may for example be arranged above an n-doped region or vice versa and a shallow trench isolation (STI) serpentine or comb structure 470 may form trenches reaching through the first doped region into the second doped region. The p-doped region and/or the n-doped region (e.g. the doping region divided by the shallow trench isolation serpentine structure) may form the electrical test structure.

A defect detection circuit 440 may be connected to the first lateral doping region 450 and the second lateral doping region 460. The defect detection circuit 440 may detect an increase of the leakage current or a decrease of a breakthrough voltage between the first lateral doping region 450 and the second lateral doping region 460. The first lateral doping region 450 of the membrane structure 430 and a second lateral doping region 460 of the membrane structure 430 may e.g. form a planar diode.

The membrane structure 430 may comprise a Shallow trench isolation (STI) serpentine structure 470. The STI serpentine structure may for example comprise oxide isolation trenches for electrical separation or segregation in integrated circuits in order to avoid for example parasitic leakage paths between various devices. The recessed STI formed as a "comb transistor" or serpentine structure yields an increased drive current ($I_{ON}$) for the wide transistor than is normally available for a given integrated circuit device with a comparable spatial footprint.

The semiconductor device 400 may comprise one or more additional features corresponding to the concept or one or more embodiments described above.

Figure 5A:
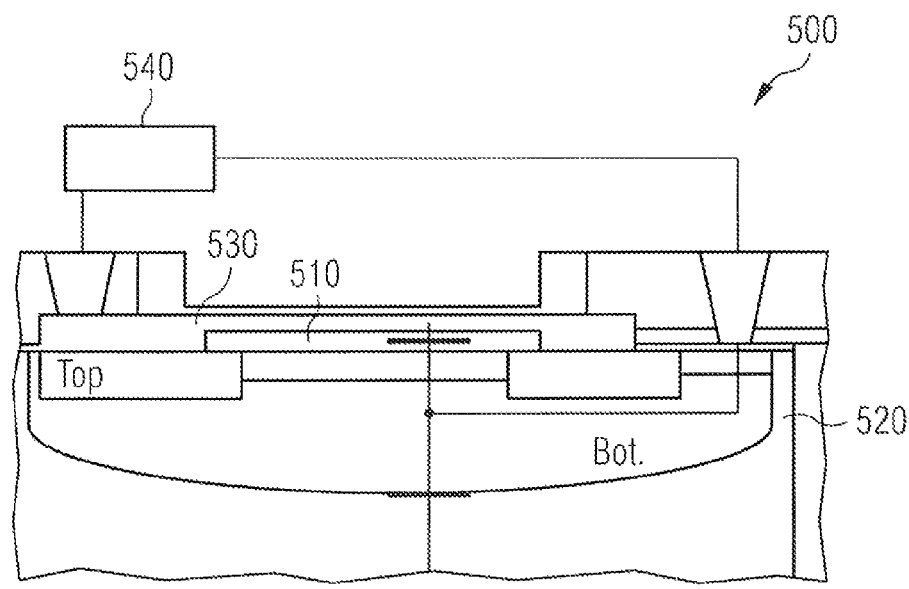
FIG. 5a shows a schematic cross-section of a semiconductor device.

FIG. 5a shows a schematic cross-section of a semiconductor device 500 according to an example. The semiconductor device 500 comprises a semiconductor substrate 520. The semiconductor device 500 comprises a membrane structure 530. The semiconductor device 500 comprises a cavity 510 arranged between at least a part of the semiconductor substrate 520 and the membrane structure 530. In the example shown in FIGS. 5a and 5b the membrane structure 530 comprises a dielectric isolating layer 533 sandwiched between an upper membrane layer 531 and a lower membrane layer 532, representing the electrical test structure.

Further, a defect detection circuit 540 may be connected to the upper membrane layer 531 and the lower membrane layer 532. The defect detection circuit 540 may for example detect an increase of the leakage current or a decrease of a breakthrough voltage between the upper membrane layer 531 and the lower membrane layer 532.

As a crack occurs in the membrane structure 530, e.g. in the upper membrane layer 531 and/or the lower membrane layer 532 an increase of the leakage current or a decrease of a breakthrough voltage between the upper membrane layer 531 and the lower membrane layer 532 may be detected by the defect detection circuit 540. An increase of the leakage current or a decrease of a breakthrough voltage between the upper membrane layer 531 and the lower membrane layer 532 may for example indicate a crack in the membrane structure 530 or at least in a part of the membrane structure 530.

The semiconductor device 500 may comprise one or more additional features corresponding to the concept or one or more embodiments described above.

Figure 5B:
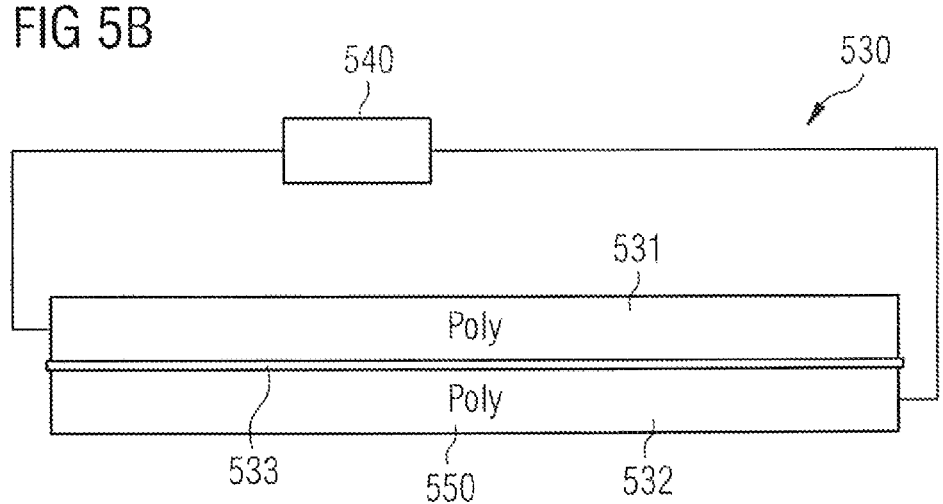
FIG. 5b shows a cross-section of a membrane structure.

FIG. 5b shows a cross-section of the membrane structure 530 of FIG. 5a in more detail. The membrane structure 530 comprises an upper membrane layer 531 and a lower membrane layer 532. The membrane structure 530 comprises a dielectric isolating layer 533 sandwiched between an upper membrane layer 531 and a lower membrane layer 532. The upper membrane layer 531 and the lower membrane layer 532 are connected to the defect detection circuit 540. The membrane structure 530 may for example comprise a nitride layer 550.

The nitride layer 550 may for example be made of or consist at least partially of a silicon nitride layer and may face the cavity 510. The nitride layer 550 may for example reduce stress on the polysilicon layer above. Alternatively layer 550 may also be made of or consist at least partially of a silicon oxide layer. Optionally, a nitride layer 500 or an oxide layer may be arranged only at one side or at both sides of the membrane structure for providing a passivation or protection of the membrane structure.

The membrane structure 530 comprising the upper membrane layer 531, the lower membrane layer 532 and the dielectric isolating layer 533 may for example have a total thickness of 200 to 400 nm, for example between 250 and 350 nm, for example 300 nm. The upper membrane layer may for example be made of or consist at least partially of aluminum (Al), copper (Cu) or poly silicon. The lower membrane may for example be made of or consist at least partially of aluminum (Al), copper (Cu) or poly silicon. The upper membrane layer and the lower membrane layer may for example be made out of the same material. Alternatively, the upper membrane layer and the lower membrane layer may for example be made out of different materials. The dielectric isolating layer 533 may for example be made of or consist at least partially of silicon dioxide ($SiO2$) or silicon nitride (SiN).

Figure 6:
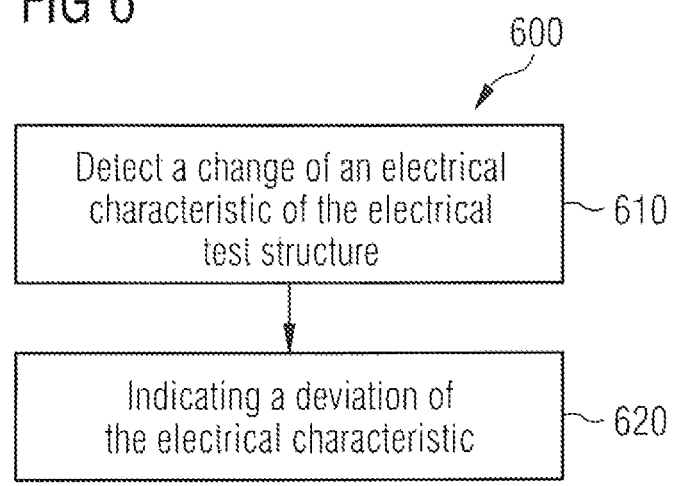
FIG. 6 shows a flowchart of a method for detecting damaging of a semiconductor device.

FIG. 6 shows a flowchart 600 of a method for detecting damaging of a micro-electro-mechanical device, the micro-electro-mechanical device comprising a movable structure. The movable structure comprises a test structure changing an electrical characteristic (e.g. if the movable structure is damaged). The method 600 comprises detecting 610 a change of an electrical characteristic of the electrical test structure of the movable structure and indicating 620 a deviation of the electrical characteristic from a predefined tolerable range.

The predefined tolerable range may be a range of values obtained by a calibration or may be derived from a test device or reference device, for example.

Further, the method for detecting damaging of a semiconductor device may comprise one or more optional additional features or acts corresponding to one or more aspects mentioned in connection with the described concept or one or more embodiments described above.

Some embodiments relate to a pressure sensor device or a microphone device comprising a semiconductor device according to the described concept or one or more embodiments described above. In other words, a semiconductor device described above may implement a pressure sensor device or a microphone device, for example.

A proposed device may enable a direct determination (e.g. without looking at the measurement/sensor signal) existing or upcoming cracks in a flexible MEMS element, for example.

Some embodiments relate to an integration scheme and method of electrical crack detection, for example for pressure sensors or (integrated) pressure sensor electrical crack detection. Embodiments relate to use an electrical test structure inserted in/on the sensor lamella itself. Embodiments relate to the implementation of a very sensitive electrical sensor lamella integrity structure which detects lamella cracks at any stage of manufacturing/field life. The electrical test structure would be drastically hampered by a crack.

For example a leakage control configuration between EPI-lamella and its gate poly cover layer, separated by a gate oxide may be read out.

A proposed semiconductor device may require no extra manufacturing costs, no change of integration scheme, no chip area penalty, may reduce crack detection costs, may increase fail capture rate, may reduce ppm fail rate, may be used to assess the sensor lamella integrity at any stage of the manufacturing process and during field life, for example.

An integrated (electrical) crack detection may enable for example, that in case of integrated sensors, standard CMOS steps/modules can be used without increase of wafer cost to set up functional structures on/in lamella to verify the device integrity electrically. Further, electrical crack detection may be applicable during frontend processing, preassembly, assembly, and in field during lifetime. This would improve device reliability due to an increased detection rate. Besides, detection costs are reduced. Further, integrity monitoring during lifetime may be a selling argument.

Some embodiments relate to the implementation of electrically assessable/testable "integrity detection" structure into/onto the lamella (membrane structure). For example, a leakage current/breakthrough current between gate poly layer (or FG, floating gate) and EPI (epitaxy) lamella may be detected. For example a suitable standard gox/tox/dgox (gate oxide, tunnel oxide) is arranged between lamella and gate poly. For example leakage current will increase if crack exists/develops.

Embodiments relate for example on the implantation of triple well comb-serpentine structure in top-surface of lamella area. Optionally STI serpentine structure may be integrated. For example a planar diode with well breakthrough measurement may be used for crack detection. For example a FG comb-serpentine below the gate-poly silicon or even w/o gate-poly may be used. For example FG-gate poly leakage/breakthrough structure may be used. For example the detection of comb resistance or (comb-serpentine) breakthrough voltage may lead to detection of cracks in the lamella (membrane structure).

The above described embodiments may for example in case of a thin lamella variant between FEOL (frontend of line)/BEOL (backend of line) with for example a carbon sacrificial layer. For example a double-lamella with dielectric isolation between poly-sheets may be used. However, implementation of crack detection structure in thin Poly lamella comes with a cost adder. Detection of leakage current between upper and lower poly sheet may be used for crack detection of the lamella (membrane structure). Relating to an embodiment the poly lamella may have for example a total thickness of 300 nm.

Embodiments may further provide a computer program having a program code for performing one of the above methods, when the computer program is executed on a computer or processor. A person of skill in the art would readily recognize that acts of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th." A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A micro-electro-mechanical device comprising:
a movable structure, wherein the movable structure comprises a test structure changing an electrical characteristic, if the movable structure is damaged, and wherein the movable structure comprises a pn-junction between a first lateral doping region of the movable structure and a second lateral doping region of the movable structure.

2. The micro-electro-mechanical device according to claim 1, wherein the movable structure comprises an electrical conductive layer representing at least a part of the test structure of the movable structure arranged over a micro-electro-mechanical element of the movable structure and electrically isolated from the micro-electro-mechanical element.

3. The micro-electro-mechanical device according to claim 2, wherein a defect detection circuit is connected to the micro-electro-mechanical element and the electrical conductive layer.

4. The micro-electro-mechanical device according to claim 3, wherein the defect detection circuit detects an increase of the leakage current or a decrease of a breakthrough voltage between the electrical conductive layer and the micro-electro-mechanical element.

5. The micro-electro-mechanical device according to claim 2, wherein the electrical conductive layer is isolated from the micro-electro-mechanical element by an oxide.

6. The semiconductor device according to claim 5, wherein a defect detection circuit is connected to the first lateral doping region and the second lateral doping region.

7. The micro-electro-mechanical device according to claim 1, wherein the defect detection circuit is configured to detect an increase of the leakage current or a decrease of a breakthrough voltage between the first lateral doping region and the second lateral doping region.

8. The micro-electro-mechanical device according to claim 1, wherein the movable structure comprises a shallow trench isolation serpentine structure.

9. The micro-electro-mechanical device according to claim 8, wherein the movable structure comprises a shallow trench isolation serpentine structures laterally separating two electrical conductive comb structures of the test structure.

10. The micro-electro-mechanical device according to claim 1, wherein the movable structure comprises a dielectric isolating layer sandwiched between an upper membrane layer and a lower membrane layer.

11. The micro-electro-mechanical device according to claim 10, wherein a defect detection circuit is connected to the upper membrane layer and the lower membrane layer.

12. The micro-electro-mechanical device according to claim 11, wherein the defect detection circuit is configured to detect an increase of the leakage current or a decrease of a breakthrough voltage between the upper membrane layer and the lower membrane layer.

13. The micro-electro-mechanical device according to claim 1, comprising a defect detection circuit connected to the movable structure, wherein the defect detection circuit is configured to detect a change of the electrical characteristic of the test structure independent from a sensing circuit detecting a main function of the movable structure.

14. The micro-electro-mechanical device according to claim 1,
wherein the test structure comprises an electrically conductive structure electrically insulated from a membrane layer of the membrane structure,
wherein the electrically conductive structure is a layer reaching throughout more than 50% of the whole membrane layer, a comb structure or a serpentine structure.

15. The micro-electro-mechanical device according to claim 1,
wherein the micro-electro-mechanical device comprising a cavity arranged between at least a part of a substrate and a membrane structure representing the movable structure,
wherein the membrane structure comprises the test structure changing an electrical characteristic, if the membrane structure is damaged.

16. The micro-electro-mechanical device according to claim 1, comprising a sensing circuit configured to sense a distortion of the membrane structure.

17. A pressure sensor device comprising a micro-electro-mechanical device comprising a movable structure, wherein the movable structure comprises a test structure changing an electrical characteristic, if the movable structure is damaged, and wherein the movable structure comprises a shallow trench isolation serpentine structure.

18. A method for detecting damaging of a micro-electro-mechanical device, the micro-electro-mechanical device comprising a movable structure, wherein the movable structure comprises a test structure changing an electrical characteristic, and wherein the movable structure comprises a dielectric isolating layer sandwiched between an upper membrane layer and a lower membrane layer, the method comprising:
detecting a change of an electrical characteristic of the electrical test structure of the movable structure; and
indicating a deviation of the electrical characteristic from a predefined tolerable range.

19. A micro-electro-mechanical device comprising:
a movable structure, wherein the movable structure comprises a test structure changing an electrical characteristic, if the movable structure is damaged,
wherein the movable structure comprises an electrical conductive layer representing at least a part of the test structure of the movable structure arranged over a micro-electro-mechanical element of the movable structure and electrically isolated from the micro-electro-mechanical element,
wherein the electrical conductive layer is isolated from the micro-electro-mechanical element by an oxide manufacturable simultaneously with a gate oxide of a transistor of the micro-electro-mechanical device, and
wherein a defect detection circuit is connected to the first lateral doping region and the second lateral doping region.

* * * * *